US012785621B2

(12) United States Patent
Farian

(10) Patent No.: US 12,785,621 B2
(45) Date of Patent: Nov. 3, 2026

(54) TRIMMING TECHNIQUE FOR OSCILLATORS

(71) Applicant: Nordic Semiconductor ASA, Trondheim (NO)

(72) Inventor: Lukasz Farian, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 0 days.

(21) Appl. No.: 19/110,734

(22) PCT Filed: Sep. 11, 2023

(86) PCT No.: PCT/EP2023/074844

§ 371 (c)(1),
(2) Date: Mar. 11, 2025

(87) PCT Pub. No.: WO2024/056576

PCT Pub. Date: Mar. 21, 2024

(65) Prior Publication Data

US 2026/0095124 A1 Apr. 2, 2026

(30) Foreign Application Priority Data

Sep. 12, 2022 (FI) .................................... 20225787

(51) Int. Cl.
*H03B 5/24* (2006.01)

(52) U.S. Cl.
CPC .................................... *H03B 5/24* (2013.01)

(58) Field of Classification Search
CPC ........................................................ H03B 5/24
USPC ........................................................ 331/143
See application file for complete search history.

(56) References Cited

U.S. PATENT DOCUMENTS

| | | | | |
|---|---|---|---|---|
| 6,356,161 | B1 | 3/2002 | Nolan et al. | |
| 2003/0034849 | A1 | 2/2003 | Sanduleanu | |
| 2013/0033307 | A1* | 2/2013 | Lin | H03H 11/0472 327/553 |
| 2018/0219536 | A1 | 8/2018 | Lee et al. | |
| 2020/0186085 | A1 | 6/2020 | Niakate | |
| 2020/0343858 | A1* | 10/2020 | Matsuno | H03K 4/502 |
| 2021/0036660 | A1 | 2/2021 | Hong | |
| 2022/0248515 | A1* | 8/2022 | Wu | H05B 45/34 |

OTHER PUBLICATIONS

International Search Report and Written Opinion of the ISA for PCT/EP2023/074844, mailed Dec. 19, 2023, 13 pages.
Finnish Search Report for FI 20225787, dated Apr. 11, 2023, 1 page.

* cited by examiner

*Primary Examiner* — Richard Tan
(74) *Attorney, Agent, or Firm* — Nixon & Vanderhye PC

(57) ABSTRACT

According to an aspect, there is provided a swing-boosted differential oscillator and a method for trimming the oscillator. The oscillator comprises a switch (110) for connecting a set of capacitors (C1, C2) alternately to power supply and ground (102, 112) based on a switching control (116A, 116B), a comparator (114) configured to produce the switching control (116A, 116B) by comparing a voltage of the capacitors (C1, C2) at the inputs (VC1, VC2) of the comparator to a preset threshold voltage, and a trimmable resistor (RCAL) connecting the inputs (VC1, VC2) of the comparator, the resistor controlling the frequency of the output (118) of the oscillator.

9 Claims, 8 Drawing Sheets

TRIMMING TECHNIQUE FOR OSCILLATORS

CROSS-REFERENCE TO RELATED APPLICATIONS

This application is the U.S. national phase of International Application No. PCT/EP2023/074844 filed Sep. 11, 2023 which designated the U.S. and claims priority to FI 20225787 filed Sep. 12, 2022, the entire contents of each of which are hereby incorporated by reference.

TECHNICAL FIELD

Various example embodiments relate to trimmable oscillators.

BACKGROUND

Oscillators are used in many types of electronic circuits. Oscillators may be used to generate signals having a desired frequency or for generating signals with desired periodicity. When oscillators are manufactured, they may be designed to provide a signal of a certain frequency (or multiple frequencies which can be switched between). However, due to impurity of materials, for example, the frequency provided by the oscillators designed to provide the same frequency may vary, and thus trimming of the oscillators may be required. In trimming of an oscillator, the output frequency of the oscillator is controlled to the desired value.

BRIEF DESCRIPTION

According to an aspect, there is provided a swing-boosted differential oscillator, comprising a switch for connecting a set of capacitors alternately to poles of a direct current source based on a switching control, a comparator configured to produce the switching control by comparing a voltage of the capacitors at the inputs of the comparator to a preset threshold voltage, a trimmable resistor connecting the inputs of the comparator, the resistor controlling the frequency of the output of the oscillator.

According to another aspect, there is provided a method for trimming a swing-boosted differential oscillator, comprising connecting by a switch a set of capacitors alternately to poles of a direct current source based on a switching control, producing by a comparator the switching control by comparing a voltage of the capacitors at the inputs of the comparator to a preset threshold voltage, controlling the frequency of the output of the oscillator by a trimmable resistor connecting the inputs of the comparator.

The aspects provide the technical effect that the output frequency of an oscillator may be trimmed to a desired frequency.

One of the advantages provided by the aspects is that the trimming solution provides low power consumption and noise compared to prior art solutions. Further, trimming the oscillator does not cause glitches in the output signal of the oscillator. Further, trimming the oscillator does not cause glitches in the output signal of the oscillator.

Embodiments are defined in the dependent claims. The scope of protection sought for various embodiments is set out by the independent claims.

The embodiments and features, if any, described in this specification that do not fall under the scope of the independent claims are to be interpreted as examples useful for understanding various embodiments of the invention.

BRIEF DESCRIPTION OF DRAWINGS

In the following, example embodiments will be described in greater detail with reference to the attached drawings, in which.

DETAILED DESCRIPTION OF SOME EMBODIMENTS

The following embodiments are only examples. Although the specification may refer to “an” embodiment in several locations, this does not necessarily mean that each such reference is to the same embodiment(s), or that the feature only applies to a single embodiment. Single features of different embodiments may also be combined to provide other embodiments. Furthermore, words “comprising” and “including” should be understood as not limiting the described embodiments to consist of only those features that have been mentioned and such embodiments may contain also features/structures that have not been specifically mentioned.

It should be noted that while Figures illustrate various embodiments, they are simplified diagrams that only show some structures and/or functional entities. The connections shown in the Figures may refer to logical or physical connections. It is apparent to a person skilled in the art that the described apparatus may also comprise other functions and structures than those described in Figures and text.

Figure 1:
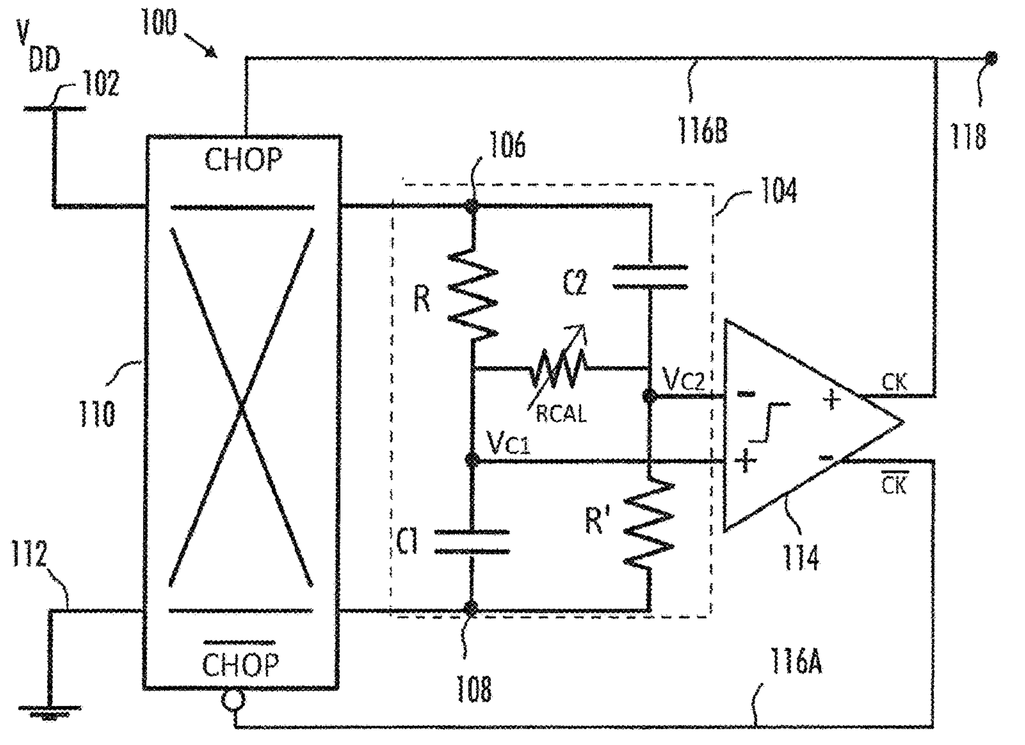
FIG. 1 illustrates an example of an oscillator.

FIG. 1 illustrates an example of an oscillator 100. The oscillator in the figure is a so-called swing-boosted differential oscillator, SBOSC. In general, swing-boosted differential oscillators offer good performance in terms of noise, power consumption and start-up time.

The oscillator 100 of FIG. 1 is configured to generate an oscillating output signal 118 using a direct current, DC, power supply 102 configured to provide a preset voltage $V_{DD}$. The oscillator of FIG. 1 comprises a resistor-capacitor, RC, circuit 104 operationally connected to the DC power 102 via nodes 106, 108 via a switch 110.

The RC circuit 104 of the oscillator comprises a set of capacitors C1, C2, each of the capacitors being connected in series to a resistor, R, R'. In the example of FIG. 1, the capacitor C1 is connected in series to a resistor R, and the capacitor C2 is connected in series to a resistor R'. Both capacitor-resistor series are connected in parallel at the node 106 and the node 108.

In the example of FIG. 1, in the series connection of the capacitor C1 and the resistor R, the capacitor C1 is connected to the node 108, and the resistor R is connected to the node 106. In the series connection of the capacitor C2 and the resistor R', the capacitor C2 is connected to the node 106 and the resistor R' is connected to the node 108. In an embodiment, the values of the resistors R and R' are equal and likewise the values of capacitors C1 and C2 are equal.

The switch 110 is configured to connect capacitors of the RC circuit 104 alternately to poles of a direct current source, either to the DC power 102 or a ground 112 based on a switching control 116A, 116B. In an embodiment, the switch 110 may be configured to connect each of the capacitors C1, C2 in turn to the DC power 102 or the ground 112 based on a switching control 116A, 116B. In an embodiment, the switch 110 may be a chopper switch.

In an embodiment, when either of the capacitors is connected to the DC power 102, the other capacitor maybe connected simultaneously to ground 112. Thus, as in the example of FIG. 1 where the capacitors are connected to the switch via nodes 106, 108, while node 106 is connected to the DC power, node 108 is connected to the ground. Likewise, when node 108 is connected to the DC power, the node 106 is connected to the ground.

The oscillator of FIG. 1 further comprises a comparator 114. The comparator receives an input from the RC circuit 104 nodes VC1 and VC2. The comparator is configured to produce the switching control 116A, 116B by comparing a voltage of the capacitors C1, C2 at the inputs VC1, VC2 of the comparator to a preset threshold voltage. The switching control 116A, 116B may be used to control the switch 110. Output 118 of the comparator is a signal having a desired frequency.

In an embodiment, the switch 110 may be controlled by the switching control 116A, 116B generated by the comparator alternately to connect each of the capacitors C1, C2 to the DC power supply 102 or the ground 112 at each switching period, and thus a difference between voltages of the capacitors may be greater than or equal to a voltage of the DC power supply 102 at each switching period.

Figure 2:
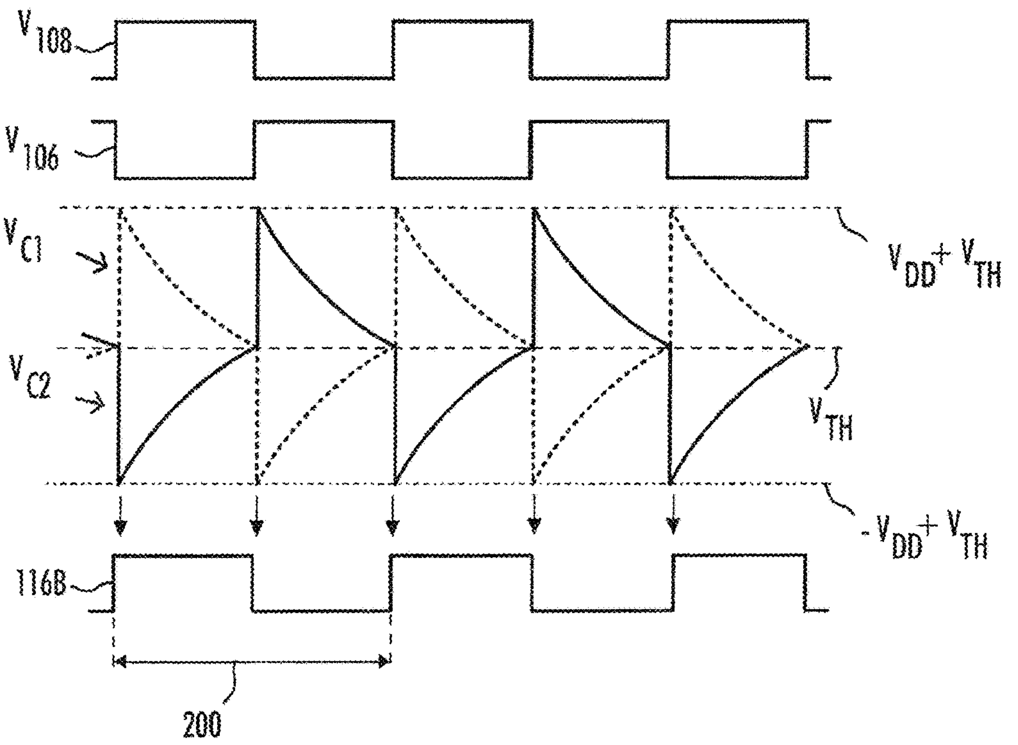
FIG. 2 illustrates an example of varying voltages at different nodes of an oscillator.

FIG. 2 illustrates how the voltage of each of the capacitors C1, C2 changes when switching is performed based on the switching control. FIG. 2 illustrates the voltages of nodes 106 and 108. As mentioned, the switch 110 connects the nodes either to DC power supply or to ground, based on the switching control 116A, 116B. FIG. 2 illustrates the switching control 116B. The switching control 116A would be inverted in view of the switching control 116B.

Referring to FIG. 2, a switching period 200 may denote the time of the voltage cycle of the switching control.

In FIG. 2, a voltage of the switching control 116B may become a preset high voltage at each switching period. The switching control controls the switch to connect the nodes 106, 108 either to DC power supply 102 or to ground 112. This causes variations in the voltages of each of the capacitors C1, C2 and thus voltages of nodes VC1 and VC2, which are illustrated in FIG. 2. When the voltage of the switching control 116B is high, the node 106 is connected to the DC power 102, having thus the voltage $V_{DD}$, and the node 108 is connected to the ground. In an embodiment, the comparator 114 is configured to adjust the switching control 116A, 116B by comparing voltages at VC1 and VC2 to a preset threshold voltage, for example.

When the voltages at points VC1 and VC2 are equal to $V_{TH}$, the comparator 114 is configured to invert the switching control 116A (and respectively 116B). Thus, a high voltage switching control is set to low voltage and a low voltage switching control is set to high voltage. This in turn will cause the switch 110 to connect the voltage at node 106 from the DC power 102 to ground 112 and respectively the voltage at node 108 from ground 112 to the DC power 102. Thus, when the switching control is inverted by the comparator 114, the voltages at nodes 106, 108 change between the DC power 102 and ground 112.

As illustrated in FIG. 2, when the voltage of the switching control 116B becomes high voltage, the voltage at point VC2 gets value $-V_{DD}+V_{TH}$, and the voltage at point VC1 gets value $V_{DD}+V_{TH}$. As long as the voltage of the switching control 116B is high, the voltage at point VC2 increases to $V_{TH}$, and the voltage at point VC1 decreases to $V_{TH}$.

When the voltages at points VC1 and VC2 are equal to $V_{TH}$ again, the switching control 116B may be inverted again.

As illustrated in FIG. 2, the voltages at points VC1 and VC2 change between values $-V_{DD}+V_{TH}$ and $V_{DD}+V_{TH}$ according to the switching control. Likewise alternates the output 118 of the oscillator.

As mentioned above, manufactured oscillators (as many other components as well) usually need trimming because of the manufacturing tolerances and variations in the manufacturing materials, for example varying impurity of the materials may cause deviations to the operation of the oscillators. However, trimming of such oscillator is challenging due to high sensitivity to parasitic capacitance and resistance at oscillating nodes (VC1 and VC2 in FIG. 1). Adding trimming switches in series or parallel to R, R' or C1, C2 increases noise and power consumption of the oscillator. Also, integral and differential non-linearities, INL and DNL, of frequency transfer function is poor due to introduced additional parasitic capacitance. Some oscillators, especially once used as a part of closed loop systems, are required to tune their frequency to obtain lock of the close loop. Hence, it is desirable to be able to tune the frequency of the oscillator freely without risk of glitches at the clock output.

In an embodiment, the trimming of the oscillator may be performed by a trimmable resistor, RCAL, connecting the nodes VC1, VC2 of the comparator. By adjusting the resistance of the trimmable resistor the operation of the oscillator may be controlled. Below an example of the trimmable resistor is described in detail with reference to FIG. 3

In an embodiment, the trimmable resistor RCAL comprises an even number of resistors R1, R2, . . . , RX, R0, R1', R2', . . . , RX', R0' connected in series. The resistors may be considered to form a set of resistor pairs. The outermost resistors R0, R0' at the ends of the series form a first resistor pair. The next outermost resistors RX, RX' at the ends of the series form a second resistor pair and two middle resistors R1, R1' of the series form a last resistor pair.

The trimmable resistor further may comprise a set of switches, with a switch SW1, SW2, . . . , SWX for each resistor pair except for the first resistor pair. The switches are arranged in such a manner that when a switch is closed the corresponding resistor pair is bypassed. Thus, if the switch SW1 is closed, the resistors R1, R1' are bypassed for example. Further, when a switch of the trimmable resistor is closed the corresponding resistor pair and all inner resistor pairs of the corresponding a resistor pair are bypassed. Thus, when the switch SW3 is closed, both resistor pairs R1, R1', R2, R2' and R3, R3' are bypassed, for example.

The trimmable resistor further may comprise a switch controller 300 for controlling the opening and closing of the switches. In an embodiment, the switch controller controls the opening and closing of the switches such that only one switch at a time is closed. At the input of the switch controller is a control signal 302 with which the opening and closing of the switches may be controlled. In an embodiment, the switch controller is a one-hot encoder. At the output of the switch controller is switch control signal 304 which may be a digital signal comprising a digital word with a given number of bits, where only one bit has a value of '1' (or high) and all other bits have the value of '0' (or low). This digital word may control the switches such that only the switch corresponding to the bit with the values '1' is closed and all others are open. Thus, with the control signal 302, the resistance value of the trimmable resistor may be controlled and the output frequency of the oscillator 100 trimmed to a desired value.

The following equation describes the frequency of the output 118 of the oscillator 100 as a function of the resistance value of the trimmable resistor RCAL:

$$F_{OSC} = \frac{1}{R \parallel RCAL * 2C \ln 3},$$

where || denotes parallel connection of resistors R and RCAL, R is the value of the resistors R, R' in the RC circuit 104, RCAL is the resistance value of the trimmable resistor RCAL and C is the capacitance value of C1 and C2 in the RC circuit.

The proposed solution has many advantages. For example, integral and differential non-linearity, INL and DNL is good. Due to one-hot encoding and symmetrical structure of the trimmable resistor frequency transfer function the achieved DNL is low. In prior art binary encoding DNL suffers from parasitic effect of switches especially for most significant bit, MSB, transitions e.g. 011111→100000. One-hot encoding removed this effect.

Figure 3:
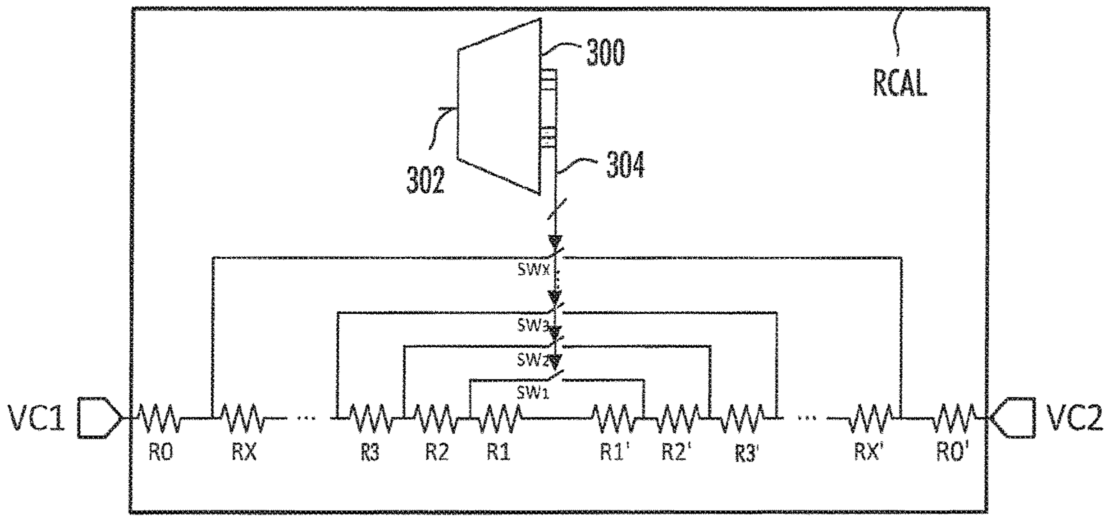
FIG. 3 illustrates an example of the structure of a trimmable resistor.

Further, compared to traditional trimming techniques, power consumption of the solution of FIGS. 1 and 3 is lower because parasitic capacitance and resistance experienced by nodes VC1 VC2 are reduced by moving trimming switches into the trimmable resistor.

The more parasitic capacitance there is on nodes VC1 and VC2, the bigger the capacitors C1 and C2 should be to compensate for voltage swing loss due to capacitive divider effect. The size of capacitors C1 and C2 directly impacts power consumption. Thus, lower parasitic capacitance on nodes VC1 and VC2 results in lower power consumption due to smaller C1 and C2 needed.

Further, voltage swing inside the trimmable resistor RCAL is limited due to applied resistive divider principle. Therefore, impact of parasitic capacitance introduced by trimming switches on power consumption is reduced compared to prior art trimming solutions.

Also, the charge between C1 and C2 is partly shared (re-used) through the trimmable resistor RCAL during charge/discharge cycles which further improves power consumption.

Higher voltage swing of nodes VC1 and VC2 results in better noise performance because voltage transitions at the input of the comparator 114 are sharper.

The proposed solution of FIGS. 1 and 3 provides a glitch-free trimming. Trimming of an oscillator while the oscillator is operating is safe when using the proposed solution of FIGS. 1 and 3. In a traditional trimming solution, where values of R or C1 are adjusted, any glitch or charge injection from the trimming switch would cause nodes VC1 and VC2 to experience glitch and hence the comparator output would produce clock with glitch. In contrast, in the solution of FIGS. 1 and 3, the trimmable resistors are located inside the trimmable resistor RCAL and they are isolated from the nodes VC1 and VC2 by series resistors. Further, one-hot encoding ensures that gross charge injection from trimming switches is close to zero, i.e. charge injection from switch being enabled and disabled cancels out.

Figure 4:
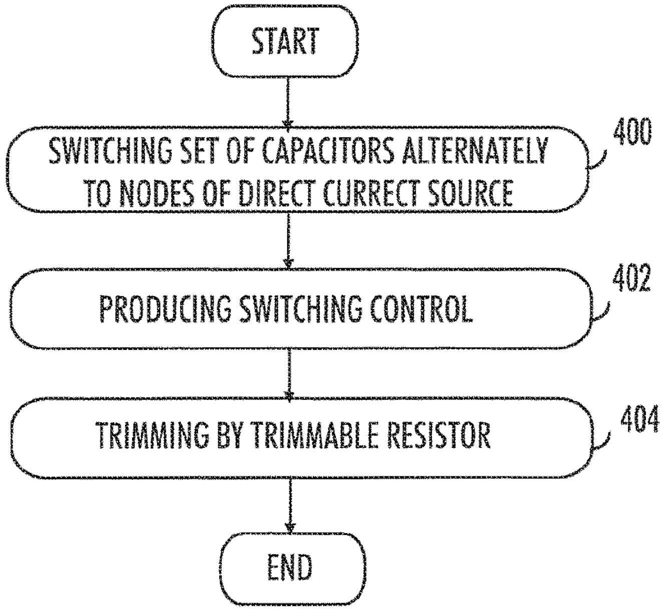
FIG. 4 is a flowchart illustrating an embodiment.

FIG. 4 is a flowchart illustrating an embodiment. The flowchart illustrates the operation of trimming the oscillator 100 of FIG. 1

Step 400 comprises connecting by a switch 110 a set of capacitors C1, C2 alternately to poles (102, 112) of a direct current source based on a switching control 116A, 116B.

In step 402, a comparator 114 produces the switching control 116A, 116B by comparing a voltage of the capacitors C1, C2 at the inputs VC1, VC2 of the comparator to a preset threshold voltage.

Step 404 comprises controlling or trimming the frequency of the output 118 of the oscillator by a trimmable resistor RCAL connecting the inputs VC1, VC2 of the comparator.

Figure 5:
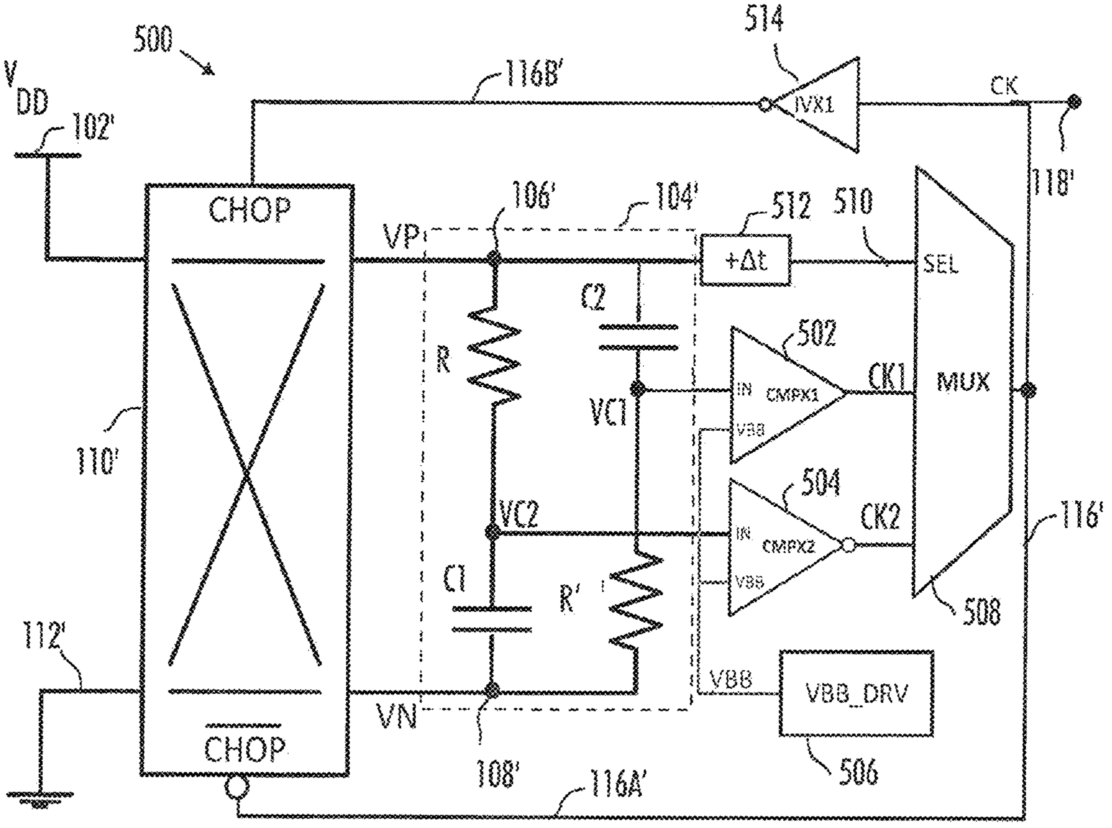
FIG. 5 illustrates an example of another oscillator.

FIG. 5 illustrates an example of an oscillator 500. As in FIG. 1, the oscillator in the figure is a so-called swing-boosted differential oscillator, SBOSC. In general, swing-boosted differential oscillators offer good performance in terms of noise, power consumption and start-up time.

The oscillator 500 of FIG. 5 is configured to generate an oscillating output signal 118' using a direct current, DC, power supply 102' configured to provide a preset voltage $V_{DD}$. The oscillator of FIG. 5 comprises a resistor-capacitor, RC, circuit 104' operationally connected to the DC power 102' via nodes 106', 108' and a switch 110'.

The RC circuit 104' of the oscillator comprises a set of capacitors C1, C2, each of the capacitors being connected in series to a resistor, R, R'. In the example of FIG. 5, the capacitor C1 is connected in series to a resistor R, and the capacitor C2 is connected in series to a resistor R'. Both capacitor-resistor series are connected in parallel at the node 106' and the node 108'.

In the example of FIG. 5, in the series connection of the capacitor C1 and the resistor R, the capacitor C1 is connected to the node 108', and the resistor R is connected to the node 106'. In the series connection of the capacitor C2 and the resistor R', the capacitor C2 is connected to the node 106' and the resistor R' is connected to the node 108'. In an embodiment, the values of the resistors R and R' are equal and likewise the values of capacitors C1 and C2 are equal.

As in the example of FIG. 1, the switch 110' of FIG. 5 is configured to connect capacitors of the RC circuit 104' alternately to poles of a direct current source, either to the DC power 102' or a ground 112' based on a switching control 116A', 116B'. In an embodiment, the switch 110' may be configured to connect each of the capacitors C1, C2 in turn to the DC power 102' or the ground 112' based on a switching control 116A', 116B'. In an embodiment, the switch 110' may be a chopper switch.

In an embodiment, when either of the capacitors is connected to the DC power 102', the other capacitor maybe connected simultaneously to ground 112'. Thus, as in the example of FIG. 1, where the capacitors are connected to the switch via nodes 106', 108', while node 106' is connected to the DC power, node 108' is connected to the ground. Likewise, when node 108' is connected to the DC power, the node 106' is connected to the ground.

The oscillator of FIG. 5 further comprises two comparators, a first comparator 502 and a second comparator 504. The first comparator 502 receives an input from the RC circuit 104' node VC1 and from a driver circuit 506. The second comparator 504 has its output inverted and it receives an input from the RC circuit 104' node VC2 and from the driver circuit 506. The first comparator is configured to produce a control signal CK1 and the second comparator is configured to produce a control signal CK2 by comparing a voltage of the capacitors C1, C2 at the inputs VC1, VC2 of the comparator to a threshold voltage. The threshold voltage may be controlled by the signal received from the driver circuit. In an embodiment, the threshold voltage of the two comparators is the same. The control signals CK1 and CK2 are connected to a multiplexer 508, which is configured to select either of the control signals CK1 and CK2 as the switching control 116A', 116B' taken to the switch 110'. In an embodiment, either control 116A' or 116B' connected to the switch via an inverter 514.

The switching control 116A', 116B' may be used to control the switch 110'. Output 118' of the comparator is a signal having a desired frequency.

In an embodiment, the switch 110' may be controlled by the switching control 116A', 116B' generated by the comparators 502 and 504, 502 alternately to connect each of the capacitors C1, C2 to the DC power supply 102' or the ground 112' at each switching period, and thus a difference between voltages of the capacitors may be greater than or equal to a voltage of the DC power supply 102' at each switching period.

Figure 6:
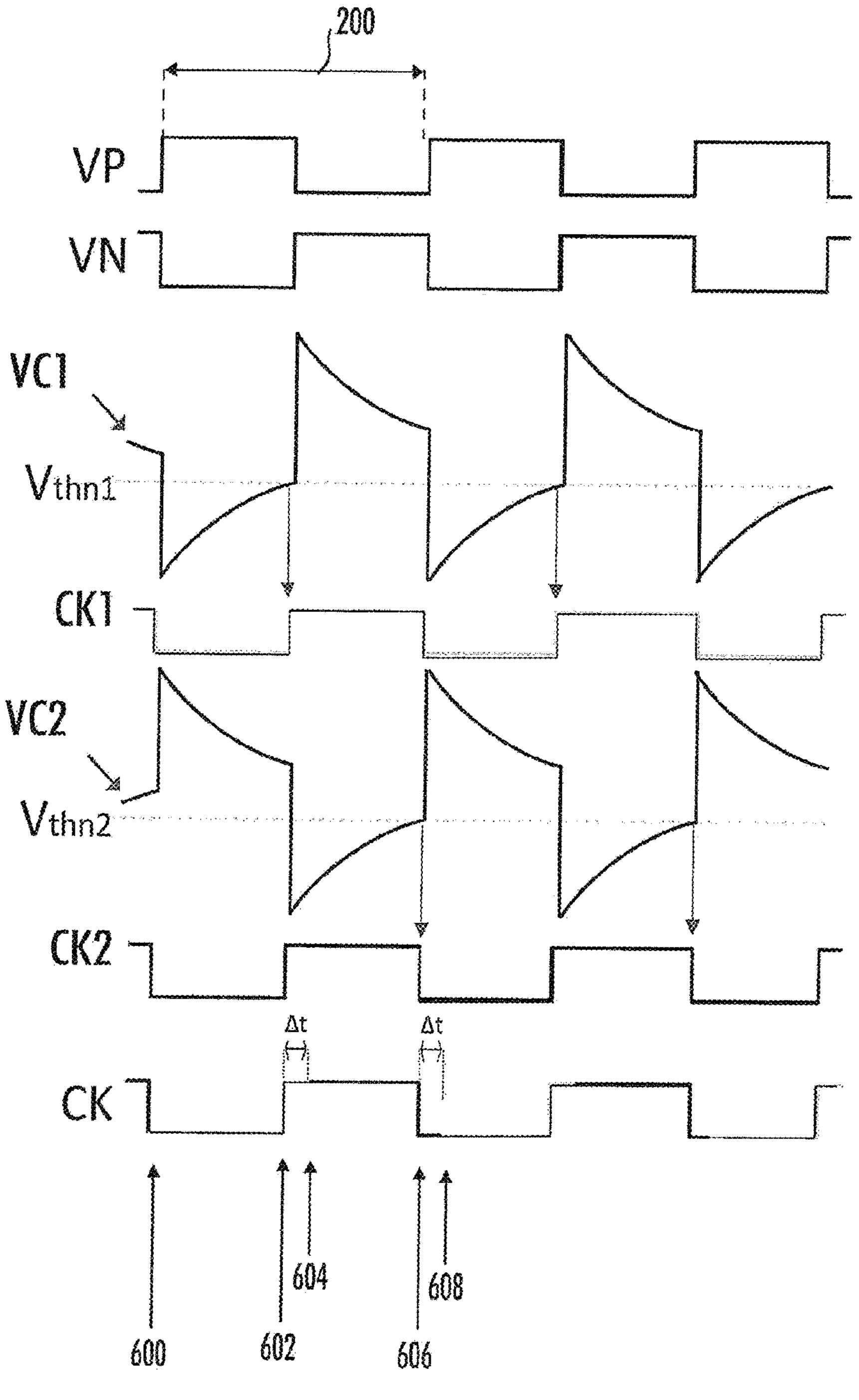
FIG. 6 illustrates an example of varying voltages at different nodes of the oscillator of FIG. 5.

FIG. 6 illustrates how the voltage of each of the capacitors C1, C2 changes when switching is performed based on the switching control. FIG. 6 illustrates the voltages VN and VP of nodes 106' and 108'. As mentioned, the switch 110' connects the nodes either to DC power supply or to ground, based on the switching control 116A', 116B'. FIG. 6 illustrates the switching control 116B'. The switching control 116A' would be inverted in view of the switching control 116B'.

Referring to FIG. 6, a switching period 200 may denote the time of the voltage cycle of the switching control.

The oscillator 500 of FIG. 5 operates mainly in a similar manner as the oscillator 100 of FIG. 1, but there are certain differences due to the different structure. In an embodiment, only one comparator of the comparators 502, 504 at a time is used to provide the switching control of the switch 110'. The multiplexer 508 is configured, by the select input 510, to select as the output signal of the multiplexer either the signal CK1 or CK2.

In FIG. 6 are shown the voltages at point VC1, which is the input to the first comparator and at point VC2, which is the input to the second comparator.

In FIG. 6, there is a point 600, where the VC1 is at a low voltage and VC2 is at a high voltage. VC1 is slowly charging because of a current flowing through resistor R and VC2 is slowly discharging. In an embodiment, the multiplexer is configured, by the select input 510, to select as the output signal of the multiplexer the output CK1 or CK2 of the comparator which input is increasing. For example, from point 600 onwards as long as the voltage of VC1 is charging the output CK1 of the first comparator 502 is selected by the multiplexer.

As VC1 is charging, at point 602 it will reach the threshold voltage $V_{thn1}$ of the comparator 502 and value of CK1 will toggle from 0 to 1. As the multiplexer has connected CK1 to its output, the switching control will also toggle and the switch 110 will switch polarity. VC1 will be pushed to high voltage and respectively VC2 will be pushed to low voltage. At the same time, the voltage of point 106 will change polarity from $V_{DD}$ to ground. After a given delay Δt 512, the multiplexer will change its output CK from CK1 to CK2, i.e. the output of the second comparator.

The given delay Δt is illustrated in FIG. 6. The multiplexer changes its output at point 604. Thus, before point 604 the multiplexer connects CK1 to the output of the multiplexer and after point 604 it connects CK2 to the output of the multiplexer. The switch from CK1 to CK2 is configured to be made at a different point of time than the reaching of the threshold voltage $V_{thn1}$, $V_{thn2}$ of the comparators.

After point 602 VC2 is slowly charging because of a current flowing through resistor R' and VC1 is slowly discharging. As VC2 is charging, at point 606 it will reach the threshold voltage $V_{thn2}$ of the comparator 504 and value of CK2 will toggle from 1 to 0. After a given delay Δt 512 at point 608, the multiplexer will again change its output CK, this time from CK2 to CK1, i.e. the output of the first comparator.

As the change in the multiplexer output happens at a later time than the point of time at which the comparator reaches its threshold voltage, the glitches at the multiplexer output can be avoided. While 106 and 108 change their polarities, comparators' outputs may experience short glitches. The delay 512 ensures that these glitches are not passed to the multiplexer output. In an embodiment, the given delay Δt is shorter than half a cycle 200.

In an embodiment, the first and the second comparator 502, 504 of the oscillator 500 are identical and the nodes VC1 and VC2 are operating in a complementary fashion. The first and the second comparator 502, 504 are operating in a similar fashion and half of the switching period 200 the output of the first comparator 502 is responsible for the output of the multiplexer and the oscillator and the other half of the switching period 200 the output of the second comparator 504 is responsible for the output of the multiplexer and the oscillator. The only difference between comparators is that the output of the comparator 504 is inverted, while 502 is not.

As mentioned above, manufactured oscillators (as many other components as well) usually need trimming. In an embodiment, the trimming of the oscillator 500 of FIG. 5 may be realized by the controlling the speed or propagation delay of the comparators 502, 504 by adjusting the threshold voltages $V_{thn1}$, $V_{thn2}$ of the comparators 502, 504, as the threshold voltage has an effect on the frequency of the output signal of the oscillator 500.

Figure 7:
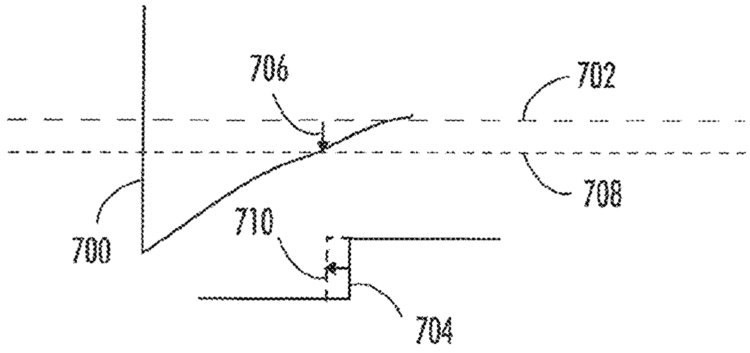
FIG. 7 illustrates an example of adjusting threshold voltage of a comparator.

FIG. 7 illustrates an example. The figure illustrates the voltage of VC1 700 which is slowly charging towards threshold voltage 702. When the threshold voltage is reached, the value of CK1 at the comparator output changes 704. If the threshold voltage is changed as illustrated by the arrow 706, the voltage of VC1 700 reaches the new threshold 708 earlier and the value of CK1 at the comparator output changes earlier 710.

Figure 8:
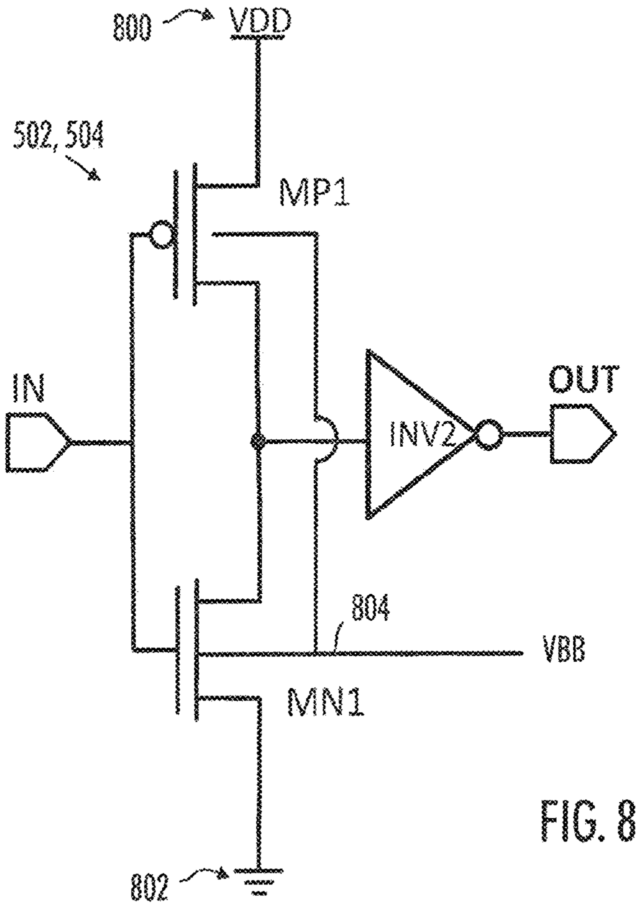
FIG. 8 illustrates an example of the structure of a comparator.

FIG. 8 illustrates an example of the comparator 502 or 504. The comparator in this example is realized with a CMOS (complementary metal-oxide semiconductor) inverter comparator. The comparator comprises a PMOS (P-channel metal-oxide-semiconductor) transistor MP1 and an NMOS (N-type metal-oxide-semiconductor) transistor MN1. The transistors are connected between a a power supply 800 and ground 802.

In an embodiment, the threshold voltages of the transistors MP1 and MP2 may be controlled with a back gate bias input 804. The back gate bias control signal VBB is provided to the comparators 502, 504 from the driver circuit 506. Utilizing the back gate bias input 804 the speed or propagation delay of the comparators 502, 504 may be adjusted and thus the operating frequency of the oscillator trimmed.

This adjusting provides a fine trimming of the oscillator frequency. The frequency may be adjusted with fine steps.

Figure 9:
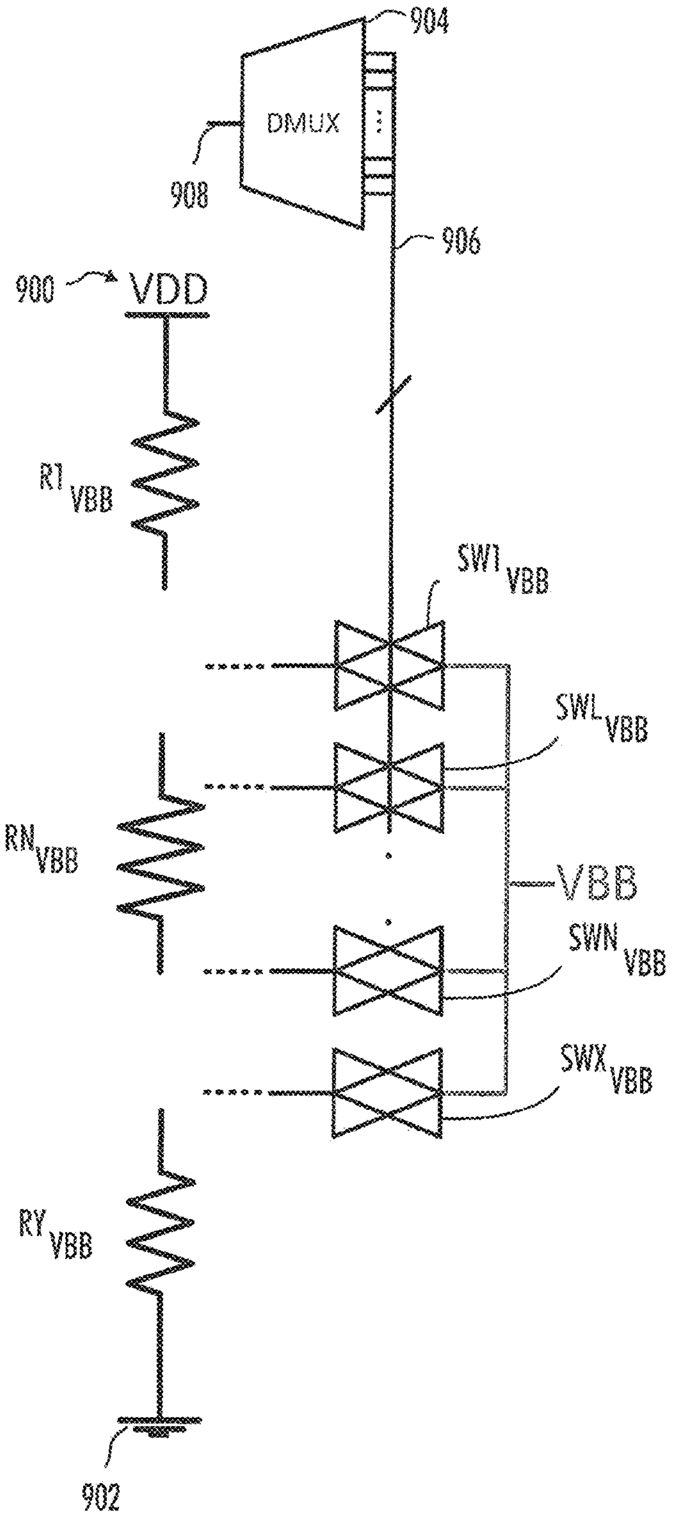
FIG. 9 illustrates an example of the structure of a driver circuit.

FIG. 9 illustrates an example of the structure of the driver circuit 506. The circuit of FIG. 9 comprises a given number of resistors $R1_{VBB}$, . . . , $RN_{VBB}$, . . . , $RY_{VBB}$ connected in series between a power supply 900 and ground 902.

In an embodiment, the driver circuit is connected to the same power supply and ground as the comparators. Thus, in an embodiment, the power supply 900 and ground 902 are the same as the power supply 800 and ground 802 of FIG. 8. This has the advantage of minimizing the effect of possible variations in supply voltage. The supply voltage variations modulate the propagation delay of the comparators. However, as the same supply is applied to the driver circuit, the same variations apply to the driver circuit and VBB as well. This compensates the effect of variations to the comparators.

The driver circuit further comprises a set of switches ($SW1_{VBB}$, . . . , $SWL_{VBB}$, . . . , $SWN_{VBB}$, . . . , $SWX_{VBB}$). Each switch of the set of switches is connected between the connection between two different successive resistors and the output VBB of the driver circuit. In an embodiment, there is a switch connected between every resistor of the series. In an embodiment, there may be more than one resistor between the switches.

The driver circuit further comprises a switch controller 904 for controlling 906 the opening and closing of the switches.

In an embodiment, the switch controller 904 controls the opening and closing of the switches such that only one switch at a time is closed. At the input of the switch controller 904 is a control signal 908 with which the opening and closing of the switches may be controlled. In an embodiment, the switch controller is a one-hot encoder. At the output of the switch controller is switch control signal 906 which may be a digital signal comprising a digital word with a given number of bits, where only one bit has a value of '1' (or high) and all other bits have the value of '0' (or low). This digital word may control the switches such that only the switch corresponding to the bit with the values '1' is closed and all others are open. Thus, with the control signal 908, the resistance value of the serial connection of resistors may be controlled and the output signal of the driver circuit controlled to a desired voltage. The one-hot structure of the switch controller 904 provides a glitch free operation of the comparators.

In an embodiment, the driver circuit is configured to reduce the voltage of the control signal VBB for the back gate bias circuitry to lower the frequency of the output signal of the oscillator.

In an embodiment, the driver circuit is configured to increase the voltage of the control signal VBB for the back gate bias circuitry to increase the frequency of the output signal of the oscillator.

Figure 10A:
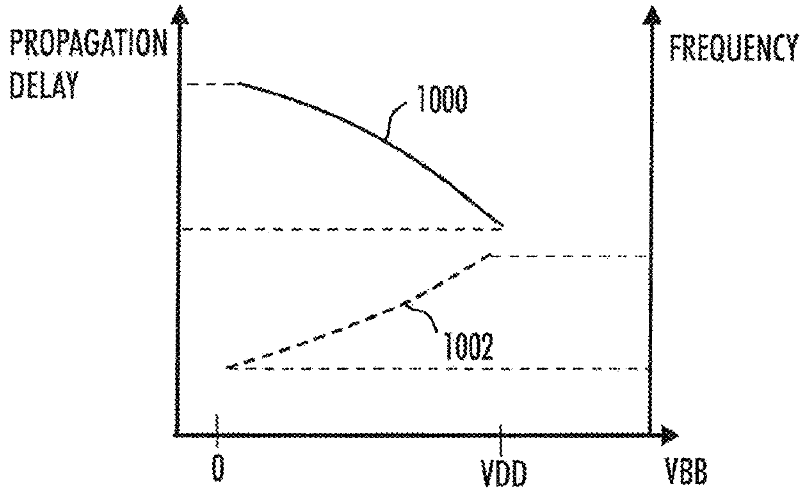
FIGS. 10A and 10B illustrate examples of trimming operation.

In an embodiment, the resistors of the driver circuit connected in series are of equal resistance value. This has the advantage of introducing linearity to the control of VBB. FIG. 10A illustrates an example. On the x-axis is voltage VBB, which in this example may vary from 0 to $V_{DD}$. As the VBB changes, the propagation delay 1000 slowly decreases, i.e. the comparators work faster. Accordingly, the output frequency 1002 of the oscillator increases. The increase of the frequency is almost linear.

In an embodiment, the driver circuit may also be realized with a MOSFET (metal-oxide-semiconductor field-effect transistor) divider with a low current density.

Assume now RCAL is replaced by an electrical conductor. Trimming the RC-circuit including R, R', C1 and C2 of the swing boosted RC oscillator 100 is challenging without RCAL. The challenge comes from the fact that the capacitors C1 and C2 must be very small (in order of few femto Farads fF, for example) to achieve high power efficiency. Trimming R1 and R' or C1&C2 with an array or additional trimmable components is not possible without reducing the efficiency and noise performance of the oscillator. The reduction of the power efficiency and noise performance is caused by the additional parasitic capacitance and resistance introduced to the nodes VC1 and VC2. Any additional parasitic capacitance on VC1 and VC2, in turn, reduces swing of these nodes and hence more power is needed to achieve the same frequency, and noise performance is worse because the slope of the oscillating nodes VC1 and VC2 is less steep. Introducing RCAL as a short resistor between VC1 and VC2 has thus many advantages:

1. Reduced parasitic C and R seen by VC1 and VC2 nodes, and hence higher frequency and lower power consumption is achieved
2. Glitch-free frequency change on-the-fly, changing the RCAL value can be done at any time with respect to clock state, as it will not cause frequency glitch
3. Power saving due to the charge recirculation between capacitors from both of the RC-networks. A part of the charge from C1 is passed to C2 and vice versa during the oscillation phase.

As explained earlier in this document, RCAL may be organized in a form of symmetrically distributed pairs between VC1 and VC2. This kind of arrangement can ensure that the parasitic capacitance seen from VC1 and VC2 is at least approximately the same. If the parasitic capacitance does not match, clock duty cycle would be skewed not equal to desirable 50%. This is advantageous because VC1 and VC2 are sensitive to additional parasitic capacitance.

Another reason for using the symmetrical RCAL combined with the one-hot encoding is to be able to change the oscillator frequency on-the-fly: RCAL value can be changed while the oscillator is enabled. Frequency change on-the-fly is safe because the trimmable resistor RCAL is not connected directly to the comparator. Hence, any glitch (or charge injection from the trimming switches) does not cause comparator to double the clock. RCAL is isolated from the VC1 and VC2 nodes by the series resistors R0 and R0' (see FIG. 3). Also due to a relatively large RC constant inside RCAL, resistance update is slow and does not cause VC1 and VC2 to glitch. Finally, thanks to one-hot encoding, gross charge injection from trimming switches is close to zero. This is because in the one-hot encoding always 2 switches toggle when trimming value is changed: one switch becomes open, and one switch becomes closed. This ensured that charge injection from the opening switch will be absorbed by the closing switch.

Figure 11:
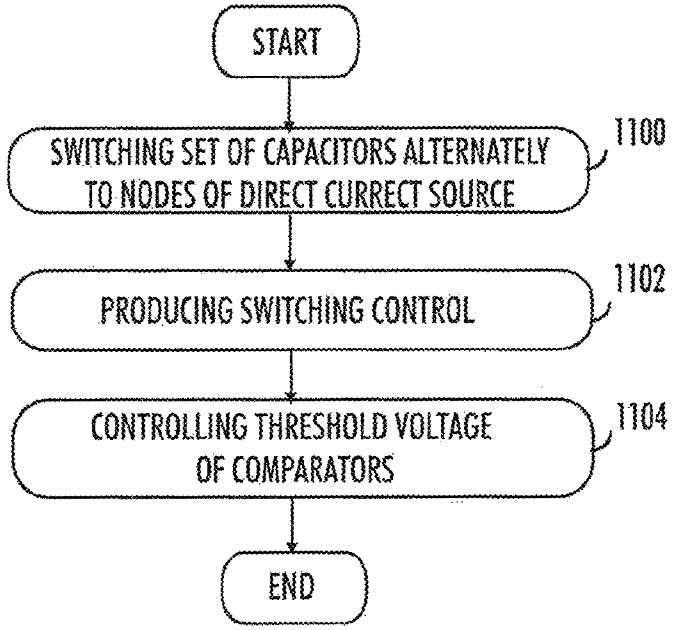
FIG. 11 is a flowchart illustrating an embodiment.

FIG. 11 is a flowchart illustrating an embodiment. The flowchart illustrates the operation of trimming the oscillator 500 of FIG. 5

Step 1100 comprises connecting by a switch (110') a set of capacitors (C1, C2) alternately to poles (102', 112') of a direct current source based on a switching control (116').

Step 1102 comprises producing by two comparators (502, 504) the switching control (116') by comparing a voltage of the capacitors (C1, C2) at the inputs (VC1, VC2) of the comparator to a preset threshold voltage.

In step 1104 the frequency of the output (118') of the oscillator is trimmed by a back gate bias circuitry for controlling the threshold voltage of the comparators.

The proposed solution has many advantages.

The solution provides low power consumption and low noise. Compared to traditional trimming techniques, where values of R, R' and/or C1, C2 are adjusted, power consumption is lower because smaller parasitic capacitance and resistance are introduced at nodes VC1 and VC2. Instead, trimming may be implemented by tuning the back-gate voltage of inverter-based comparator. This intro-duces no additional parasitics at high-frequency oscillating nodes.

The more parasitic capacitance on the nodes VC1 and VC2, the bigger C1 and C2 should be to compensate for voltage swing loss due to capacitive divider effect. The size of C1 and C2 directly impacts power consumption (expressed in W/Hz). Hence, lower parasitic capacitance on the nodes VC1 and VC2 results in lower power consumption due to smaller C1 and C2 needed.

Further, the higher voltage swing of the nodes VC1 and VC2 results in better noise performance because voltage transitions at the input of the comparators are sharper.

The proposed solution provides a glitch-free trimming. Trimming update while oscillator is operating is safe when using the proposed solution. If trimming was traditionally implemented on R, R' or C1, C2 any glitch or charge injection from the trimming switch would cause a sensitive node VC1 or VC2 to experience glitch and hence the comparator output would produce clock with glitch.

Figure 10B:
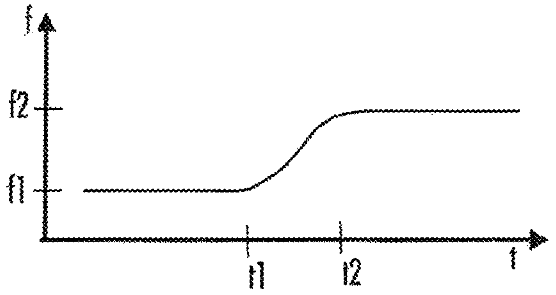

The proposed solution provides smooth change in the output frequency of the oscillator. This is illustrated in FIG. 10B. On x-axis is time and on y-axis is the output frequency of the oscillator. At first, the output frequency has the value of f1. At time t1, trimming operations is applied by changing the value of VBB. The frequency smoothly transitions to value f2 without any glitches or under- or over-shooting.

Further, integral and differential non-linearity, INL and DNL is good. In an embodiment, when one-hot encoding of the back-gate voltage is applied the frequency transfer function is monotonic and DNL is low. In binary encoding DNL suffers from parasitic effect of switches especially for MSB transitions e.g. 011111→100000. One-hot encoding removed this effect.

Further, the proposed solution provides high trimming resolution. In general, the threshold sensitivity of a comparator to back-gate voltage change is low. Hence, this trimming scheme can be used to fine-tune frequency of the oscillator. A change in VBB may result in a small change in the output frequency. Thus, the frequency may be adjusted accurately.

In an embodiment, the trimming method illustrated in FIG. 1 and the method illustrated in FIG. 5 may be applied in the same oscillator. A coarse trimming may be applied by utilising the trimmable resistor (RCAL) and the trimming may be fine-tuned by the use of the VBB control.

Embodiments described herein are applicable to various systems employing oscillators. The systems and details of such systems develop rapidly. Such development may require extra changes to the described embodiments. Therefore, all words and expressions should be interpreted broadly, and they are intended to illustrate, not to restrict, the embodiment. It will be obvious to a person skilled in the art that, as technology advances, the inventive concept can be implemented in various ways. Embodiments are not limited to the examples described above but may vary within the scope of the claims.

The invention claimed is:

1. A swing-boosted differential oscillator, comprising:

a switch configured to connect a set of capacitors alternately to poles of a direct current source based on a switching control, a comparator configured to produce the switching control by comparing a voltage of the capacitors in the set of capacitors at inputs of the comparator to a preset threshold voltage, a trimmable resistor connected between the inputs of the comparator, the trimmable resistor being configured to control a frequency of output of the swing-boosted differential oscillator.

2. The swing-boosted differential oscillator of claim 1, wherein the trimmable resistor comprises:

a plurality of resistors connected in series, the resistors in the plurality of resistors forming a plurality of resistor pairs, such that outermost resistors in the plurality of resistors at ends of the series form a first outermost resistor pair, next outermost resistors in the plurality of resistors at the ends of the series form a second next outermost resistor pair, and two middle resistors in the plurality of resistors of the series form a last innermost resistor pair, the plurality of resistors having an even number of resistors, a plurality of bypass switches, each bypass switch in the plurality of bypass switches having a corresponding resistor pair from the plurality of resistor pairs, the plurality of bypass switches including a first bypass switch provided for the second next outermost resistor pair and a second bypass switch provided for the last innermost resistor pair, the first outermost resistor pair lacking a corresponding bypass switch, wherein when the first bypass switch is closed the second next outermost resistor pair is bypassed and when the second bypass switch is closed the last innermost resistor pair is bypassed, and a switch controller configured to control opening and closing of each bypass switch in the plurality of bypass switches.

3. The swing-boosted differential oscillator of claim 2, wherein the resistors in the plurality of resistors connected in series are of equal value.

4. The swing-boosted differential oscillator of claim 2, wherein each bypass switch in the plurality of bypass switches, when closed, is configured to bypass its corresponding resistor pair and all inner resistor pairs of the plurality of resistor pairs interior thereto.

5. The swing-boosted differential oscillator of claim 2, wherein the switch controller is configured to control the opening and closing of the bypass switches in the plurality of bypass switches such that only one bypass switch in the plurality of bypass switches is closed at a time.

6. The swing-boosted differential oscillator of claim 2, wherein the switch controller is a one-hot encoder.

7. A method for trimming a swing-boosted differential oscillator, the method comprising:

connecting, by a switch, a set of capacitors alternately to poles of a direct current source based on a switching control, producing, by a comparator, the switching control by comparing a voltage of the capacitors in the set of capacitors at inputs of the comparator to a preset threshold voltage, controlling a frequency of output of the swing-boosted differential oscillator by a trimmable resistor connected between the inputs of the comparator.

8. The method of claim 7, further comprising:

adjusting a resistance of the trimmable resistor by a switch controller, the switch controller controlling opening and closing of a plurality of bypass switches for a plurality of resistors connected in series, the resistors in the plurality of resistors forming a plurality of resistor pairs, outermost resistors in the plurality of resistors at ends of the series forming a first outermost resistor pair in the plurality of resistor pairs, next outermost resistors in the plurality of resistors at the ends of the series forming a second next outermost resistor pair in the plurality of resistor pairs, and two middle resistors in the plurality of resistors of the series forming a last innermost resistor pair in the plurality of resistor pairs, the plurality of resistors having an even number of resistors, wherein the trimmable resistor comprises the plurality of bypass switches, each bypass switch in the plurality of bypass switches having a corresponding resistor pair from the plurality of resistor pairs, the plurality of bypass switches including a first bypass switch provided for the second next outermost resistor pair and a second bypass switch provided for the last innermost resistor pair, the first outermost resistor pair lacking a corresponding bypass switch, wherein when the first bypass switch is closed the second next outermost resistor pair is bypassed and when the second bypass switch is closed the last innermost resistor pair is bypassed, the switch controller controlling the opening and closing of the bypass switches in the plurality of bypass switches such that only one bypass switch in the plurality of bypass switches is closed at a time.

9. The method of claim 8, further comprising: bypassing a given resistor pair of the plurality of resistor pairs and all resistor pairs of the plurality of resistor pairs interior thereto when the bypass switch of the plurality of bypass switches corresponding to the given resistor pair is closed.

* * * * *